United States Patent [19]

Robertson et al.

[11] Patent Number: 5,043,732

[45] Date of Patent: Aug. 27, 1991

[54] ANALOG-TO-DIGITAL CONVERTER EMPLOYING A PIPELINE MULTI-STAGE ARCHITECTURE

[75] Inventors: David H. Robertson, Somerville; Peter Real, Groveland; Christopher W. Mangelsdorf, Reading, all of Mass.

[73] Assignee: Analog Devices, Inc., Norwood, Mass.

[21] Appl. No.: 555,657

[22] Filed: Jul. 18, 1990

Related U.S. Application Data

[63] Continuation of Ser. No. 412,414, Sep. 26, 1989, abandoned.

[51] Int. Cl.$^5$ .............................................. H03M 1/14
[52] U.S. Cl. ................................... 341/156; 341/161
[58] Field of Search ......................... 311/156, 161, 162

[56] References Cited

U.S. PATENT DOCUMENTS

| | | | |
|---|---|---|---|
| 3,721,975 | 8/1973 | Brinkman et al. | 341/156 |
| 3,846,786 | 11/1974 | Brown et al. | 341/156 |
| 4,535,319 | 8/1985 | Penney | 341/156 |
| 4,763,107 | 8/1988 | Koen et al. | 341/156 |
| 4,893,124 | 1/1990 | Tsuji et al. | 341/156 |
| 4,908,621 | 3/1990 | Polonio et al. | 341/156 |

OTHER PUBLICATIONS

Beck, F. and Bergmann, G., "A Monolithic 6 Bit Sub-converter for High Speed, Resolution Sequential Flash A/D Conversion Systems", IECE (Japan) Technical Group on Circuits and Systems and IEEE Circuits and Systems Society 1985 International Symposium on Circuits and Systems.

Primary Examiner—J. R. Scott
Assistant Examiner—Marc S. Hoff
Attorney, Agent, or Firm—Wolf, Greenfield & Sacks

[57] ABSTRACT

A pipelined multi-stage ADC in which residue signals are passed between stages as currents. All sample-and-hold circuits are designed to be current-in/current-out structures; all but one also provide a voltage output. A voltage representation of the analog signal is provided as input to the flash converter within the quantization loop of each stage, allowing implementation of a conventional voltage comparator architecture in the flash converter. An extra comparator is added to the flash converter and an extra segment is included in the DAC of each stage. Inputs above full scale and below zero can be converted and generate output codes. Whenever the input goes above full scale or below zero, an out-of-range bit is set and the digital outputs are set to all ones or all zeroes, respectively. The combination of out-of-range bit and digital codes tell whether overranging or underranging occurred.

6 Claims, 6 Drawing Sheets

5,043,732

ANALOG-TO-DIGITAL CONVERTER EMPLOYING A PIPELINE MULTI-STAGE ARCHITECTURE

This is a continuation of U.S. patent application Ser. No. 07/412,333, filed 9/26/89, now abandoned.

FIELD OF THE INVENTION

This invention relates to analog-to-digital converters (ADC's), particularly ADC's fabricated using BiCMOS (i.e., bipolar and CMOS devices on the same substrate) technology.

BACKGROUND OF THE INVENTION

Multi-stage ADC's have been used for some time in situations where high resolutions are required. One common type of multi-stage converter is referred to as a subranging converter. Subranging converters provide high resolution with significantly fewer comparators and simpler logic than single-stage converters, but give up some of the inherently higher speed capabilities of single-stage parallel, or flash, converters.

FIG. 1 shows a block diagram representation of a generic pipelined multi-stage ADC for converting an analog signal to an m-bit value or series of m-bit values. The analog input $V_{in}$, is digitized through a series of multi-bit flash conversions, each of fewer than m bits. The three blocks 12A, 12B, and 12C are identical, and an expanded block diagram for those blocks is shown as block 12 in FIG. 2. Each block 12 contains a sample-and-hold amplifier (SHA) 14, a flash converter 16, and a digital-to-analog converter (DAC) 18. The block 12 provides as its output a RESIDUE OUT signal which is the difference between the output of SHA 14 and DAC 18, and is thus a representation of the error in the digital output of flash converter 16. Returning to FIG. 1, block 22 contains a flash converter only. Each of the flash converters of blocks 12A, 12B, 12C and 22 provides an X-bit representation of the input signal to that particular block. Traditionally, the range of each stage is greater than one LSB (least significant bit) of the previous stage, for error correction.

As FIG. 1 also shows, a digital delay structure is necessary to facilitate the generation of one binary word to represent the sampled analog input signal. This digital delay structure is provided by the various registers 24A–24F. Correction logic 26 combines the outputs from registers 24D–24F, and from converter 22, to provide the digital output code, which in this case is a (4X-3)-bit representation.

During operation, each of the first three stages 12A–12C samples and holds the output from the previous stage. Each stage then does a low-resolution analog-to-digital conversion on the sampled signal, and the code produced is converted back to an analog signal by a DAC. The DAC output is subtracted from the sampled input, generating the aforementioned residue signals, each of which is then passed onto the next stage. The residue signal is usually amplified, so that each stage operates with a similar input signal range, improving the tolerance to other sources in any given stage when compared with its predecessor stage. The fourth stage 22 contains an ADC only, since no residue output is generated from this block.

Previous implementations of the architecture of FIG. 1 have relied on the input and residue signals being voltages or charges. This places severe constraints on signal swing with respect to available headroom, and imposes fairly demanding settling time requirements. There is a strong move within the electronics industry toward systems using single supply voltages, such as a single five-volt supply. However, operation of such systems under this constraint is difficult.

The transfer functions of the ADC's are offset by one-half LSB, so that all analog values within a given range centered on a nominal analog value are represented by the same digital code. As shown in FIG. 3, this results in the first code (000) becoming one-half LSB wide, while the last code (111) becomes three-halves LSB wide. In a straight ADC, this does not represent a problem. However, in a pipelined architecture such as that of FIG. 1, where remainders are passed on from one stage to the next, recovery of codes representing inputs near full-scale values will require use of overrange correction codes. This leaves no room for errors at input signals levels near these values.

Further, prior implementations of the architecture of FIG. 1 have either used a dedicated sample-and-hold amplifier up front, followed by a quantizer section, as shown in FIG. 2, or have applied the analog input signal directly into a quantizer section. The timing requirements of the latter type of implementation, in terms of the tolerable skew between the sampling by the SHA and the flash converter, make operation beyond eight to nine bits extremely difficult for high bandwidth input signals.

Accordingly, it is an object of the present invention to provide a multistage ADC architecture which can be operated on a single 5V supply while still allowing substantial analog signal swing.

Another object is to provide an ADC which overcomes some of the speed and settling limitations of voltage mode ADC's.

Another object of the invention is to provide an ADC which has improved error correction when the input is close to full scale.

SUMMARY OF THE INVENTION

The foregoing and other objects as will hereinafter appear are achieved in a multistage ADC in which residue signals are passed between stages as currents. All sample-and-hold circuits are designed to be current-in/current-out structures. A voltage representation of the analog signal is provided as input to the low-resolution flash converter internal to the ADC within each quantizing loop, allowing implementation of a conventional voltage comparator architecture in the flash converter.

An extra comparator is added to the flash converter and an extra segment is included in the DAC of each stage. Inputs above full scale and below zero can be converted and generate output codes. Whenever the input goes above full scale or below zero, an out-of-range bit is set and the digital outputs are set to all ones or all zeroes, respectively.

The invention will be more fully understood from the detailed description set forth below, when read in conjunction with the accompanying drawing. The detailed description is presented by way of example only, and should not be considered limiting.

DETAILED DESCRIPTION

Figure 4:
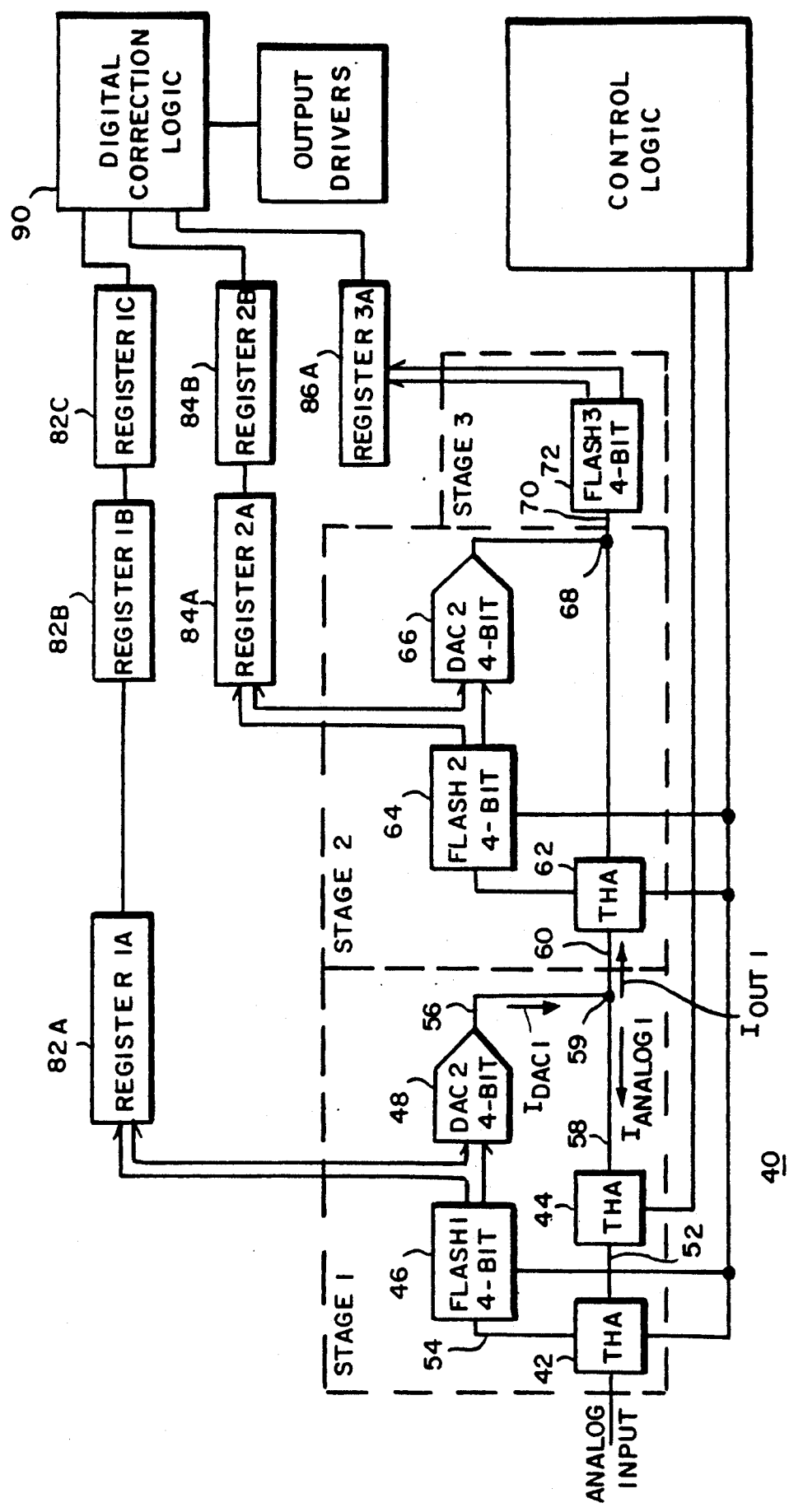
FIG. 4 is a block diagram of an analog-to-digital converter according to the present invention.

Referring to FIG. 4, a block diagram is shown for a pipelined multistage analog-to-digital converter 40 according to the invention. As an example, three stages of four-bits resolution each are illustrated. For purposes of preserving generality, the outputs of the three stages may be thought of as providing digital words of n, p and q bits, respectively. In the example, n=p=q=4. However, n, p and q may have different values, it being understood that the invention is applicable to converters employing both fewer and more stages and to stages with greater or lesser, or differing resolutions. The first stage of the converter comprises two sample-and-hold amplifiers (SHA's; also called track and hold amplifiers, or THA's) 42 and 44, a flash converter 46 (or other low resolution ADC block) and a DAC 48. Subsequent, intermediate stages are identical, except that they do not require duplication of THA 44. The final stage is simpler still, requiring only a single flash converter 72. The four-bit digital output of each of the flash converters is fed to an appropriate input register (82A, 84A, 86A) of a digital pipeline. As illustrated, four clock cycles of latency exist in the exemplary system. To avoid unnecessarily complicating the drawing and this discussion, clock signals have not been shown explicitly.

In the first stage, a first track-and-hold amplifier (THA) 42, accepts an analog current or voltage input, Ain, and provides a voltage output on line 54 and a current output on line 52. A suitable detailed design for such a THA is provided in U.S. patent application Ser. No. 07/412,412, titled "CURRENT-MODE SAMPLE-AND-HOLD AMPLIFIER", filed on even date herewith in the names of David Robertson et al and commonly assigned, the disclosure of which is hereby incorporated by reference. The current output of THA 42 is supplied to a second, similar THA 44 (which does not require a voltage output). The voltage output of THA 42 is supplied to a four-bit flash converter 46. The digital output of flash converter 46 is supplied to a register 82A, which is part of a pipeline arrangement. (Since there are three stages in this converter, the pipeline must be three layers deep. Accordingly, the first stage of the converter feeds a register chain 82A, 82B, 82C which is three registers in length; the second stage of the converter feeds a chain 84A, 84B, which is two registers in length; and the third stage of the converter feeds a chain 86A which is only one register in length.)

The digital output from converter 46 is only approximate. An error, or residue signal, is thus generated, for use in refining the digital conversion. For this purpose, the output of flash converter 46 is converted back to analog form by a current mode DAC 48. In turn, the difference between the DAC output current on line 56 ($I_{DAC1}$) and the output current on line 58 from SHA 44 ($I_{analog1}$) is provided at summing node 59 as a residue (i.e., error) output current ($I_{OUT1}=I_{DAC1}-I_{analog1}$) on line 60.

The first stage residue output is supplied to the second stage as its input; specifically, the current $I_{out1}$ is supplied to the input of a THA 62 of the same type as THA 42. A four-bit flash converter 64 generates four bits of digital output from the voltage output of THA 62, representing digitally the error of the first stage's analog-to-digital conversion. The digital code is both supplied to register 84A and converted to an analog current $I_{DAC2}$ by DAC 66. At the summing node 68, analog output current $I_{analog2}$ from THA 62 is subtracted from the DAC output $I_{DAC2}$, to provide the second stage residue out current, $I_{OUT2}$ ($I_{OUT2}=I_{DAC2}-I_{ANALOG2}$) on line 70.

The second stage output is supplied to flash converter 72 as the third stage input. The output code from that flash converter is the third stage output and is supplied directly to pipeline register 86A.

The digital outputs from each stage, or quanitizer, are combined in correction logic 90 to produce, e.g., a ten-bit representation of the analog input signal. Overrange and underrange indicators are set should the input signal be beyond the specified input range.

Note that the input to the first stage flash converter is taken from the output of the front-end THA 42. When THA 42 goes into hold mode, THA 44 goes into tracking mode. Instead of looking at the output of THA 44, as in the prior art, the flash converter 46 in essence looks at the input of that THA. This gives the flash converter more time to settle to the correct answer, and provides a speed improvement over the prior art.

Figure 1:
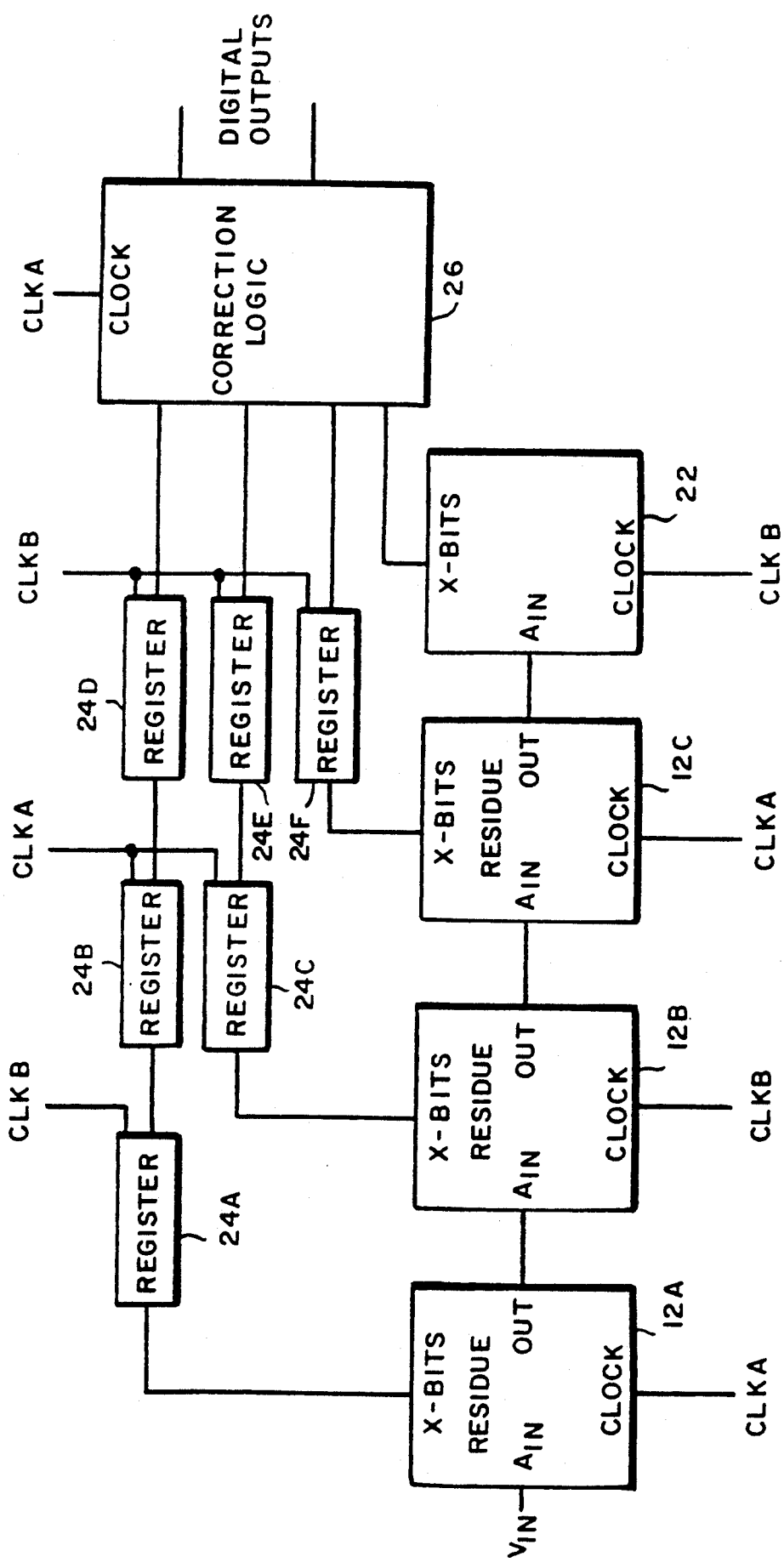
FIG. 1 is a block diagram of a generic prior art multi-stage analog-to-digital converter.
Figure 2:
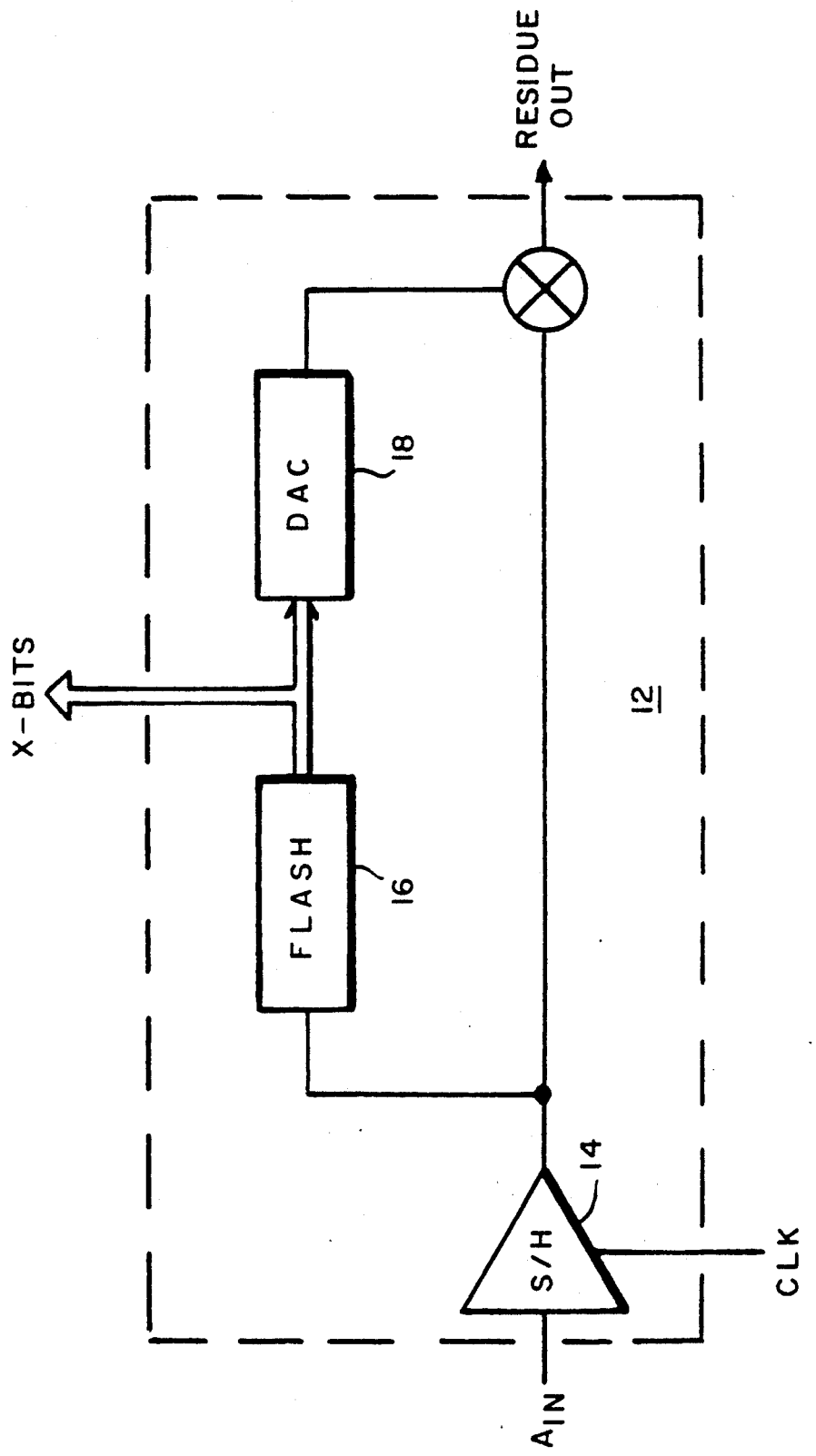
FIG. 2 is a more detailed block diagram of the x-bit conversion stages of FIG. 1.
Figure 3:
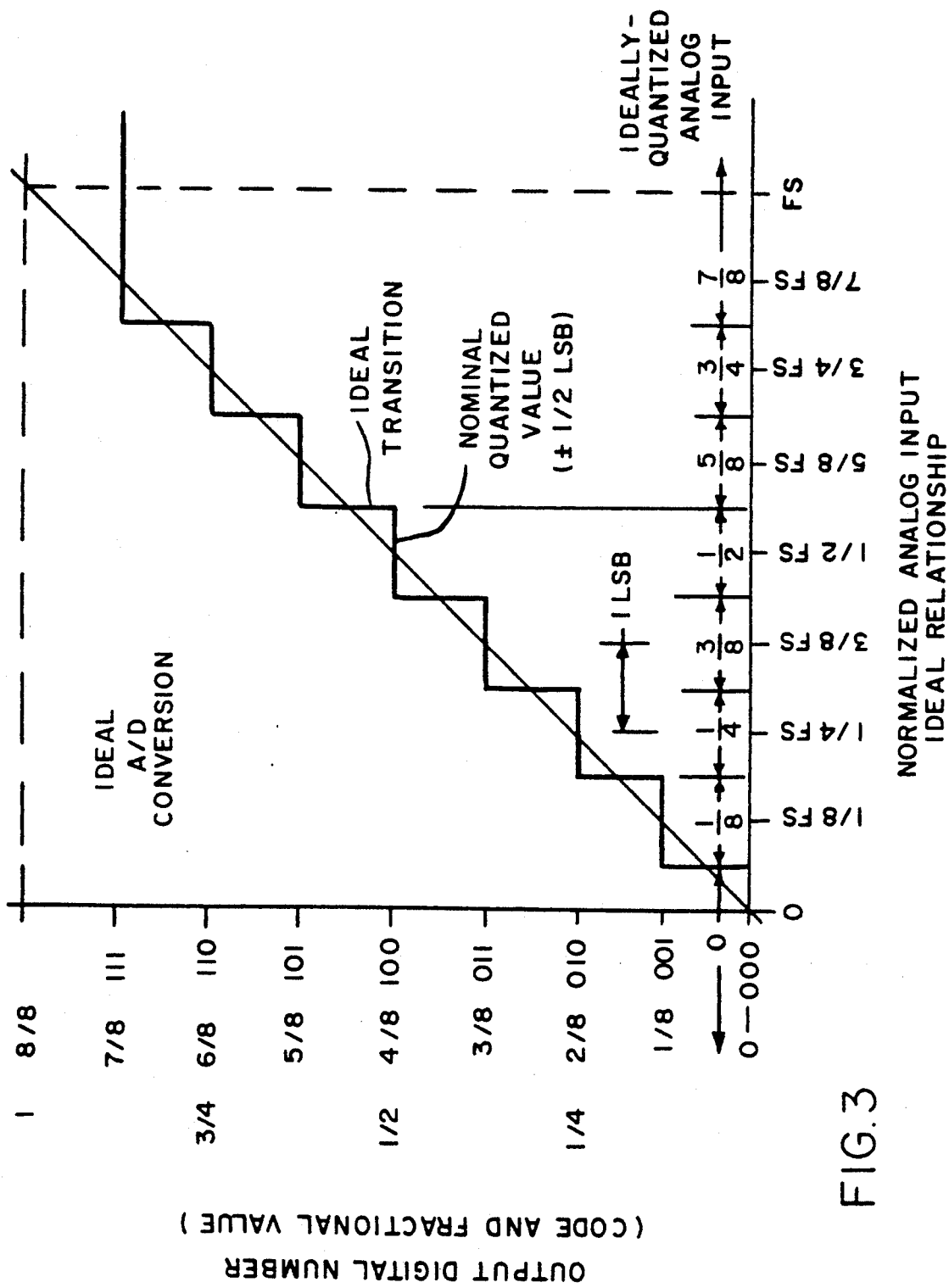
FIG. 3 is a plot of the transfer function of an ideal analog-to-digital conversion according to the prior art.
Figure 5:
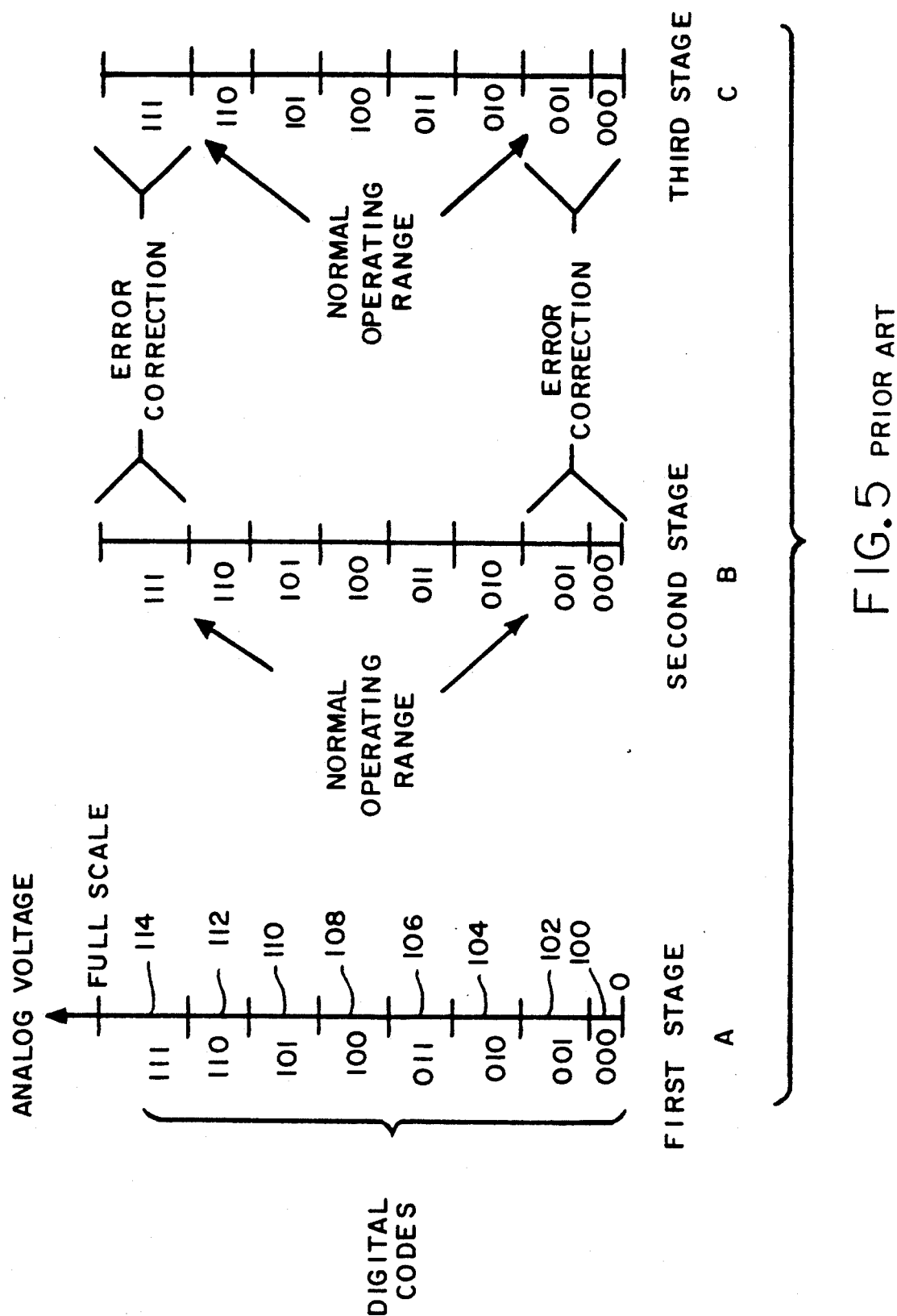
FIG. 5 is a diagrammatic representation of the digital correction process performed in a converter of the type shown in FIG. 1.

To explain the overrange and underrange correction, reference is first made to FIG. 5, which shows the operation of a prior art converter of the FIG. 1 type. The first stage flash converter 46 has a "transfer function" as illustrated in part A of the figure. A three-bit resolution is shown for the stage. Note that steps 102–112 are 1 LSB in span, while step 100 is ½ LSB in span and step 114 is 3/2 LSB in span. The flash converter of the second stage operates on the first stage's residue and has the same transfer function, shown at part B. Usually, the potential residue range is mapped onto only a portion of the full scale of the next stage. For example, the residue should be less than 1 LSB and can thus be mapped to a value lying between one-fourth and three-fourths the full scale range of the next stage. This approach is taken because the flash converter of the previous stage may give an erroneous output code. For example, it may give the next higher or the next lower code than the "correct" conversion value. When that happens, the residue will fall outside the intended range. This condition can be detected and the information can be utilized to appropriately correct the residue from the second stage, so that the third stage will, in part C, generate the correct code. Unfortunately, the steps 100 and 114 (and the corresponding first and last steps for subsequent stages) present a problem. For example, since step 114 is 3/2 LSB wide, there may be insufficient range in the next stage to accommodate the residue. An erroneous output will result.

Figure 6:
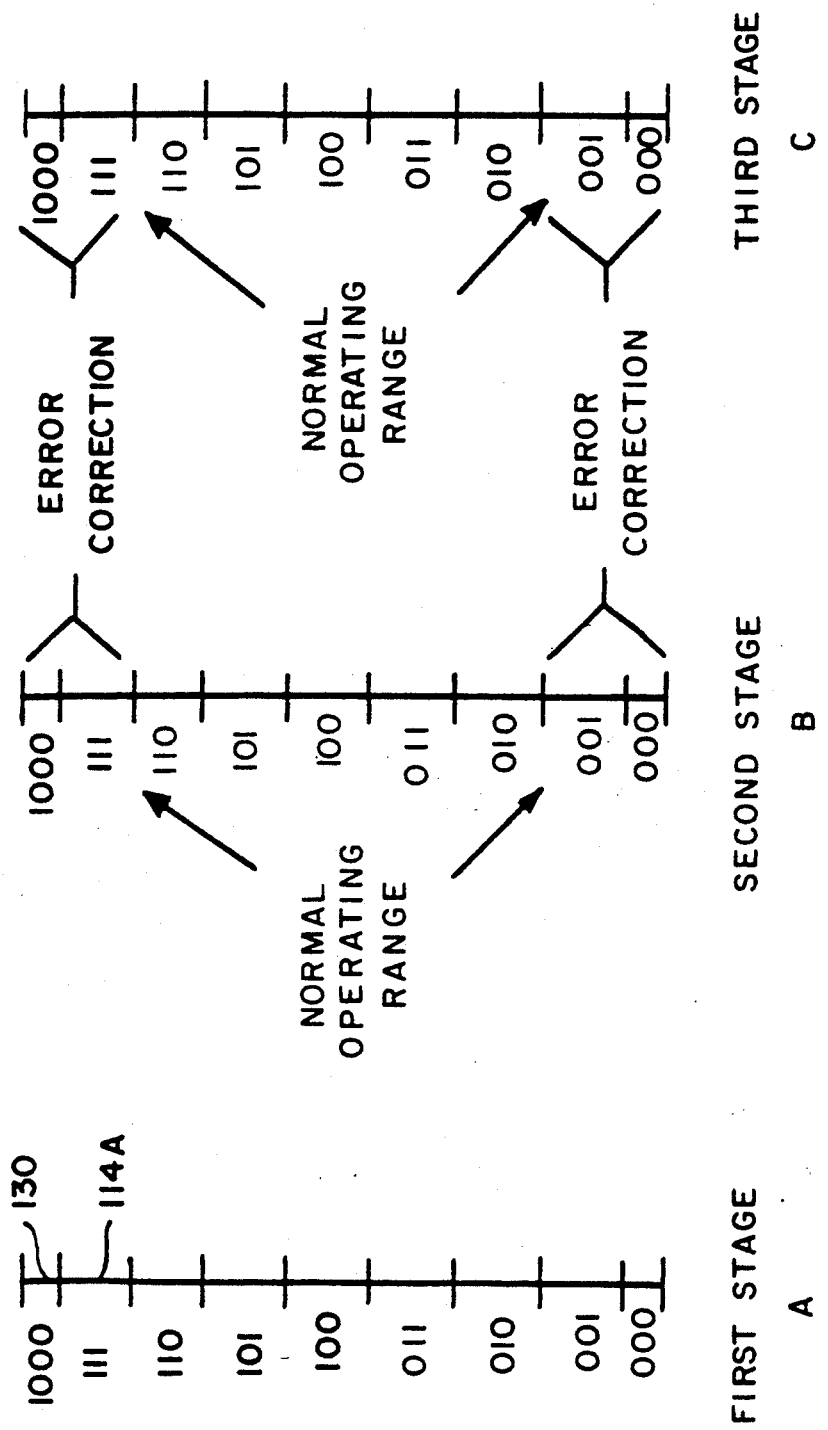
FIG. 6 is a diagrammatic representation of the digital overrange/underrange correction performed by the present invention.

The solution according to the present invention is shown in FIG. 6. As shown in part A, another step 130 is added at the top of the range of the flash converter in each stage. This, of course, requires the use of a flash converter having an additional comparator and an additional bit of resolution. The top step 130 is now ½ LSB wide, while the next lower step (the prior art top step)

114A is reduced to being one LSB wide. An overrange condition can be corrected even for the top step.

The addition of the bit to the flash converters 46,64, also requires the use of DAC's 48,66, and pipeline stages 82 84, and 86, capable of handling the additional bit (e.g., 5-bits total, instead of 4-bits).

Having thus described the inventive concept and a specific embodiment, it should be apparent that various alterations, modifications and improvements may readily be made and will occur to those skilled in the art. Thus the foregoing discussion is presented by way of example only, and is not intended to be limiting. The invention is limited only by the following claims and equivalents thereto.

What is claimed is:

1. A pipelined multistage m-bit analog-to-digital converter for converting an analog input signal to a digital output signal, comprising:
    a. a first sample-and-hold amplifier for sampling the analog input signal and providing in correspondence with each sample an analog voltage and a first analog current;
    b. a first analog-to digital converter for providing an n-bit digital word from the analog voltage;
    c. an n-bit digital-to-analog converter for providing from the n-bit digital word a second analog current;
    d. a second sample-and-hold amplifier for sampling the first analog current and providing a third analog current;
    e. means for generating a fourth current proportional to the difference between the second analog current and the third analog current;
    f. a third sample-and-hold amplifier for sampling the fourth current and providing in correspondence with each sample a second analog voltage and a fifth analog current;
    g. a second analog-to-digital converter for providing a p-bit digital word from the second analog voltage;
    h. a p bit digital-to-analog converter for providing from the p-bit digital word a sixth analog current;
    i. means for generating a seventh current proportional to the difference between the fifth analog current and the sixth analog current;
    j. a third analog-to-digital converter for providing a q-bit digital word from the seventh analog current; and
    k. means including pipeline means for combining the n-bit, p-bit and q-bit digital words to provide a digital representation of the analog input signal.

2. A pipelined multistage m-bit analog-to-digital converter for converting an analog input signal to a digital output signal, comprising:
    a. a first sample-and-hold means for sampling the analog input signal and providing in correspondence with each sample a first analog signal and a first analog current;
    b. a first analog-to-digital converter for providing an n-bit digital word from the first analog signal;
    c. an n-bit digital-to-analog converter for providing from the n-bit digital word a second analog current;
    d. means for generating a third analog current proportional to the difference between the first analog current and the second analog current;
    e. a second analog-to-digital converter for providing a q-bit digital word from the third analog current; and
    f. pipeline means for combining the n-bit and q-bit digital words to provide a digital representation of the analog input signal.

3. A pipelined multistage m-bit analog-to-digital converter for converting an analog input signal to a digital output signal, comprising:
    a. a first sample-and-hold means for sampling the analog input signal and providing in correspondence with each sample a analog translation signal and a first analog current;
    b. a first analog-to-digital converter for providing an n-bit digital word from the analog translation signal;
    c. an n-bit digital-to-analog converter for providing from the n-bit digital word a second analog current;
    d. means for generating a third analog current proportional to the difference between the first analog current and the second analog current;
    e. a second sample-and-hold means for sampling the third analog current and providing in correspondence with each sample a second analog translation signal and a fourth analog current;
    f. a second analog-to-digital converter for providing a p-bit digital word from the second analog translation signal;
    g. a p-bit digital-to-analog converter for providing from the p-bit digital word a fifth analog current;
    h. means for generating a sixth current proportional to the difference between the fourth analog current and the fifth analog current;
    i. a third analog-to-digital converter for providing a q-bit digital words from the sixth analog current; and
    j. pipeline means for combining the n-bit, p-bit and q-bit digital words to provide a digital representation of the analog input signal.

4. A pipelined multistage m-bit analog-to-digital converter for converting an analog input signal to a digital output signal, comprising:
    a. first means for converting an analog input signal into an n-bit digital word and a first analog residue signal; means responsive to the n-bit digital word and the analog input signal for providing a first analog residue signal;
    b. second means for converting the first analog residue signal into a p-bit digital word and a second analog residue signal wherein the p-bit word includes a bit to indicate that the first analog residue signal is outside of a predetermined range;
    c. means for converting the second analog residue signal into a q-bit digital word; and
    d. pipeline means for combining the n-bit, p-bit, and q-bit digital words to provide a digital representation of the analog input signal.

5. A pipelined multi-stage m-bit analog-to-digital converter for converting an analog input signal to a digital output signal, as defined in claim 4, wherein said second means includes correction means for correcting the second analog residue signal when the first analog residue signal is outside of the predetermined range.

6. A pipelined multi-stage m-bit analog-to-digital converter for converting an analog input signal to a digital output signal, as defined in claim 5, correction means comprising:
    a. a digital-to-analog converter for providing from the p-bit word a first analog correction signal,
    b. means for generating the second analog residue signal by generating an analog signal proportional to the difference between the first analog residue signal and the first analog correction signal.

* * * * *